United States Patent [19]
Schweitzer, Jr.

[11] Patent Number: 6,043,433
[45] Date of Patent: Mar. 28, 2000

[54] CABLE CLAMP WITH UNIVERSAL POSITIONING

[75] Inventor: Edmund O. Schweitzer, Jr., Northbrook, Ill.

[73] Assignee: E.O. Schweitzer Manufacturing Co., Inc., Mundelein, Ill.

[21] Appl. No.: 09/027,071

[22] Filed: Feb. 20, 1998

[51] Int. Cl.⁷ .............................. H01B 7/00; H02G 3/00; H02G 7/00
[52] U.S. Cl. ................ 174/70 R; 174/70 C; 174/40 CC; 174/40 R; 174/46
[58] Field of Search .............................. 174/70 R, 71 R, 174/70 C, 138 R, 137 R, 61, 46, 40 CC, 40 TD, 44, 45 TD, 41, 42, 43

[56] References Cited

U.S. PATENT DOCUMENTS

| | | | |
|---|---|---|---|
| 2,430,703 | 11/1947 | Bowen | 174/5 R |
| 2,968,851 | 1/1961 | Hardy | 24/135 R |
| 3,485,468 | 12/1969 | Schweitzer, Jr. | 248/74 |
| 3,868,136 | 2/1975 | Schweitzer, Jr. | 294/19 |
| 4,125,750 | 11/1978 | Cochran | 218/1 |
| 4,456,873 | 6/1984 | Schweitzer, Jr. | 324/51 |
| 4,646,006 | 2/1987 | Schweitzer, Jr. | 324/127 |
| 5,125,437 | 6/1992 | Pierce | 140/123 |
| 5,180,972 | 1/1993 | Schweitzer, Jr. | 324/127 |
| 5,274,324 | 12/1993 | Schweitzer, Jr. | 324/96 |
| 5,565,783 | 10/1996 | Lau et al. | 324/522 |

*Primary Examiner*—Kristine Kincaid
*Assistant Examiner*—Mark Olds
*Attorney, Agent, or Firm*—Cook, Alex, McFarron, Manzo, Cummings & Mehler, Ltd.

[57] ABSTRACT

A clamping mechanism for mounting a circuit conditioning monitoring device to electrical cables of various diameters includes a fixed sleeve and a movable sleeve positioned within the fixed sleeve. Both sleeves include gaps whereby an electrical cable may be pasted therethrough. The inner movable sleeve further includes a clamping means, preferably a tightening screw, whereby after a cable is passed through the gaps, the inner sleeve rotates within the outer sleeve to close the gap and further clamps onto the cable for secure mounting of the device.

22 Claims, 3 Drawing Sheets

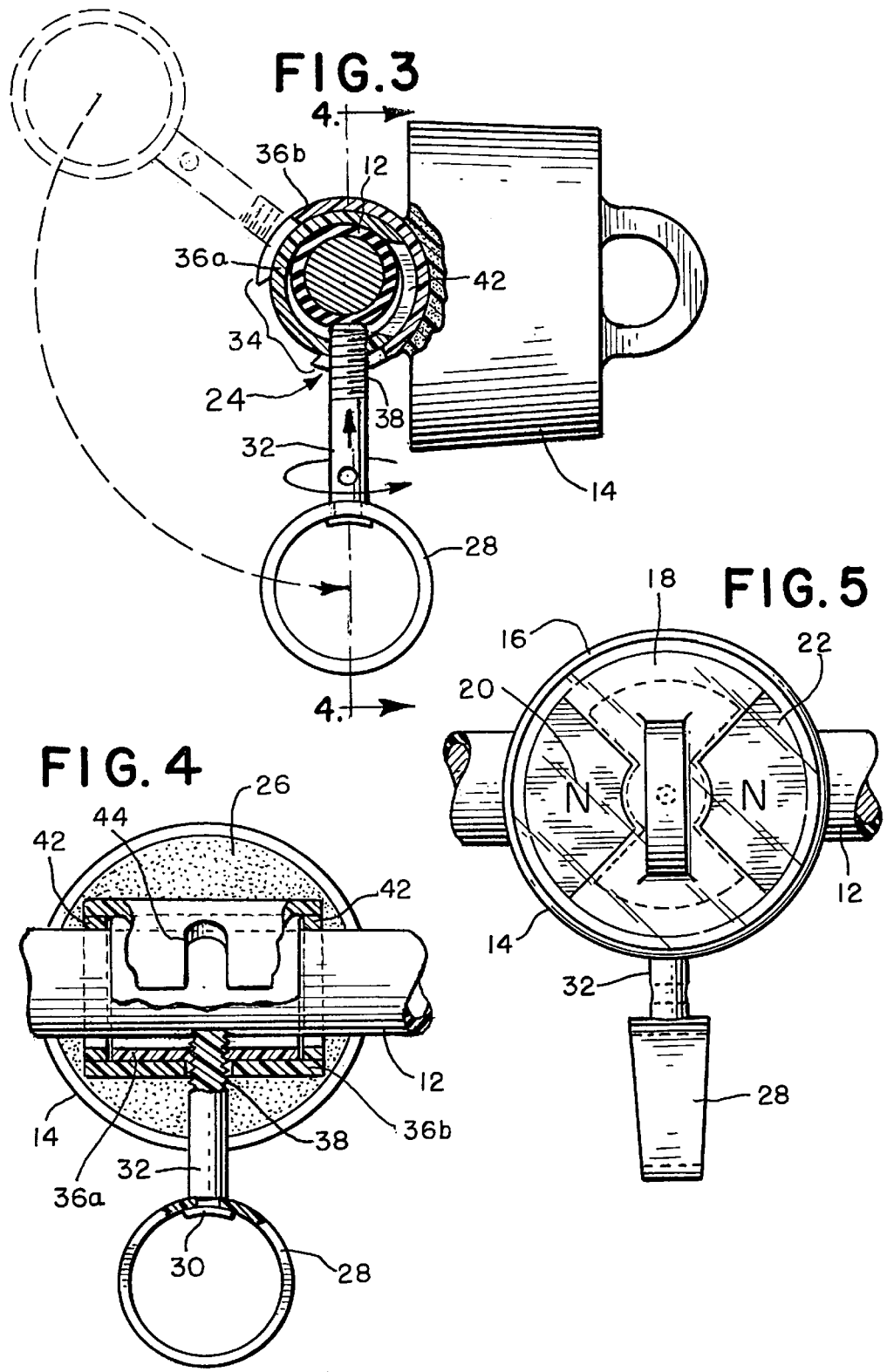

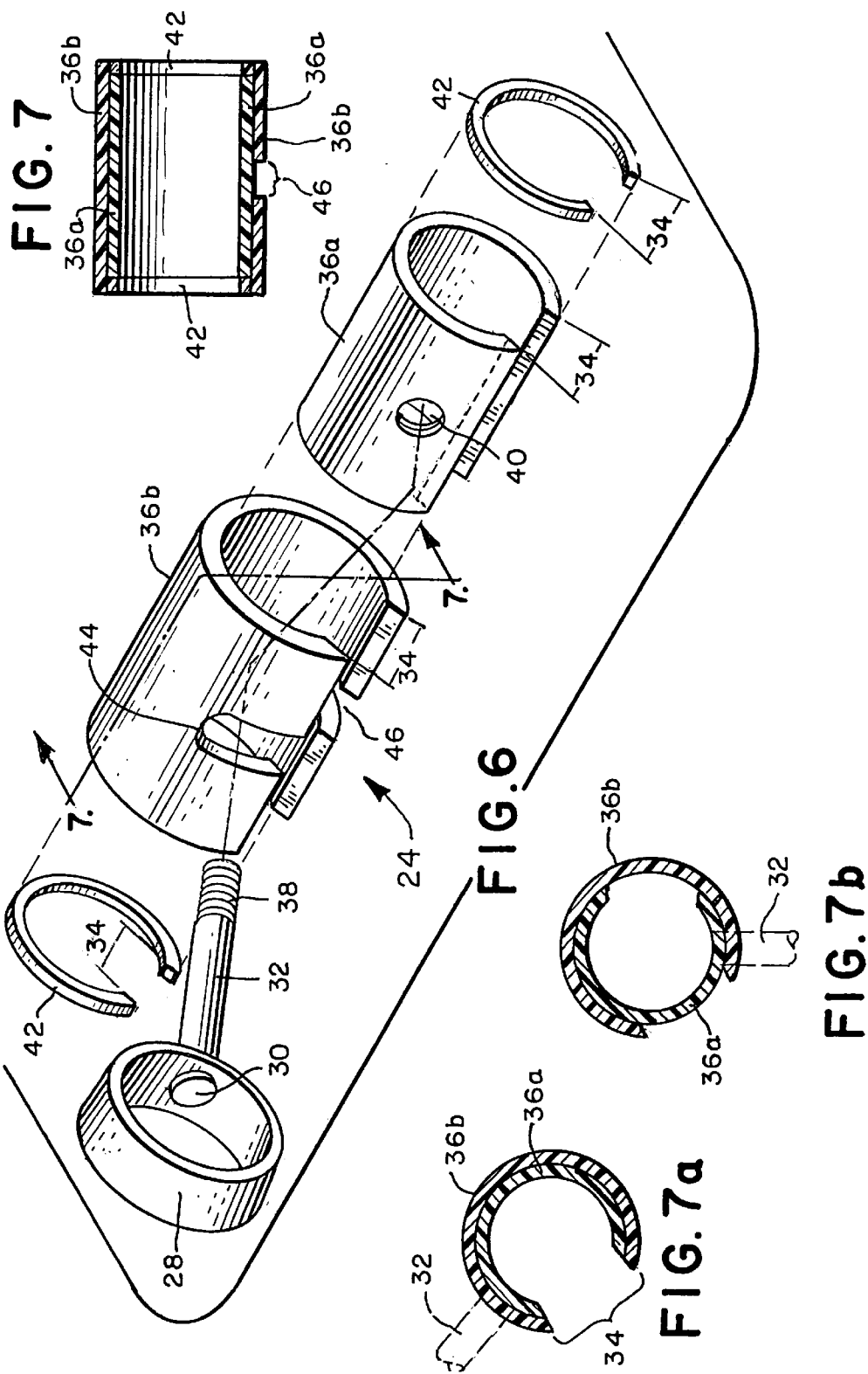

CABLE CLAMP WITH UNIVERSAL POSITIONING

BACKGROUND OF THE INVENTION

The present invention relates generally to circuit condition monitoring devices for use in electrical power distribution systems, and in particular to a clamp mechanism and housing for mounting such devices to the various sized cables of such distribution systems.

Electrical power distribution systems may require the use of a variety of circuit condition monitoring devices to facilitate the detection and location of system malfunctions. Such devices include manually and automatically reset current fault indicators, such as those manufactured by E.O. Schweitzer Manufacturing Co., and described in U.S. Pat. Nos. 4,288,743, 4,086,529 and 3,676,740 of the present inventor, as well as voltage monitoring devices, such as described in U.S. Pat. Nos. 4,251,770, 4,152,643, 4,263,350 and U.S. Pat. No. 4,550,288 of the present inventor. The devices may be either of the test point mounted type for mounting on a system test point, or of the clamp-on type, for clamping directly onto a cable of the system.

Clamp on type devices typically include a housing containing a clamp mechanism affixed to the housing for mounting the housing on the cable. Frequently, the clamp mechanism serves the additional function of establishing either magnetic or electrostatic communication, or both, between the electrical conductor in the cable and appropriate sensing components of the monitoring apparatus. Since power cables used in the industry are routinely of various diameters, it is necessary that the clamping mechanism accommodate a range of cable diameters.

In one prior clamp mechanism, which is described in U.S. Pat. No. 4,456,873 of the present inventor, a plurality of flexible metallic strips are combined to form a generally square-shaped magnetic core for use with a circuit condition monitoring device. One end of the core is affixed to the device housing, and the opposite end is detachably received within an aperture in the housing opposite the first end. In use, the free end of the core is displaced from the device housing, allowing the core to be passed around a cable. The free end is then inserted in the aperture to lock the device to the cable. Although this disclosure allows the installer of the device to virtually mount it at any place along the length of the cable, the installer must use two hands to accomplish this task. Also, such a device may not be suitable when mounting to a large range of cable diameters.

In another prior clamp mechanism described in U.S. Pat. No. 4,646,006 two inwardly biased wire clamps are pre-configured to a spaced-apart condition by a spring under compression prior to receiving the cable. The mechanism is maneuvered with a single hotstick so that the cable deforms the pre-configured spring to cause the clamp to engage the cable. Although this device allows one handed mounting via a hotstick, the biased wire clamps are prone to weaken and thus slip and effect any desired monitoring of the cable. Also, disengagement of such a device requires a force large enough to open the biased wire clamps which becomes difficult when the installer is on a ladder or the like; further, this force may damage the device or cable.

The present invention is directed to a clamping mechanism and housing whereby a monitoring device can be installed on a wide range of electrical cable diameters using a single lineman's hotstick. The device is maneuvered with the hotstick to a desired location on a cable and mounted thereto. The hotstick is then used to clamp the device securely onto a wide range of cable diameters. The one-hand installation provides for the monitoring of varying diameter cables at more diverse locations as well as contributing to safety, particularly where it is necessary for the lineman to ascent a ladder in order to install the device, or where the monitored cable is closely spaced to other cables and can only be approached from one direction.

Accordingly, it is general object of the present invention to provide a new and improved clamp mechanism and housing for circuit monitoring devices.

It is a more specific object of the present invention to provide a clamp mechanism and housing for installing a circuit condition monitoring device on the cable of a power distribution system which requires the use of one hand during installation.

It is a further object of the present invention to provide a clamp mechanism for clamping a circuit condition monitoring device to the cable of a power distribution system wherein the cable has a range of diameters.

It is a still further object of the present invention to provide a clamp mechanism for application and removal thereof to the cable of a power distribution system by the manipulation of a live line tool.

These and other objects, features and advantages of the present invention will be clearly understood through a consideration of the following detail description.

SUMMARY OF THE INVENTION

A clamping mechanism for mounting a circuit condition monitoring device on electrical cables having a predetermined range of diameters includes a pair of concentric sleeves whereby the outer sleeve is affixed to the housing and the inner sleeve is rotatable therewithin. Both sleeves include a gap to enable the cable to pass therethrough. A clamping means is included whereby when the inner sleeve is rotated to close the gap, the cable is clamped upon the device.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 3 is a cross-sectional view of the clamping mechanism taken along line 3—3 of FIG. 2 showing the clamping operation thereof onto a cable.

FIG. 4 is a cross-sectional view of the clamping mechanism taken along line 4—4 of FIG. 3.

FIG. 5 is a front elevated view of a fault indicator incorporating the clamping mechanism of FIGS. 1–4.

FIG. 6 is an exploded perspective view of the clamping mechanism of FIGS. 1–5.

FIG. 7 is a cross-sectional view of the clamping mechanism taken along line 7—7 of FIG. 6.

FIG. 7a is a cross-sectional view of the clamping mechanism of FIGS. 6–7 showing the mechanism in the open position ready to receive the cable.

FIG. 7b is the mechanism as shown in FIG. 7a in the closed position.

DESCRIPTION OF THE PREFERRED EMBODIMENT

Figure 1:
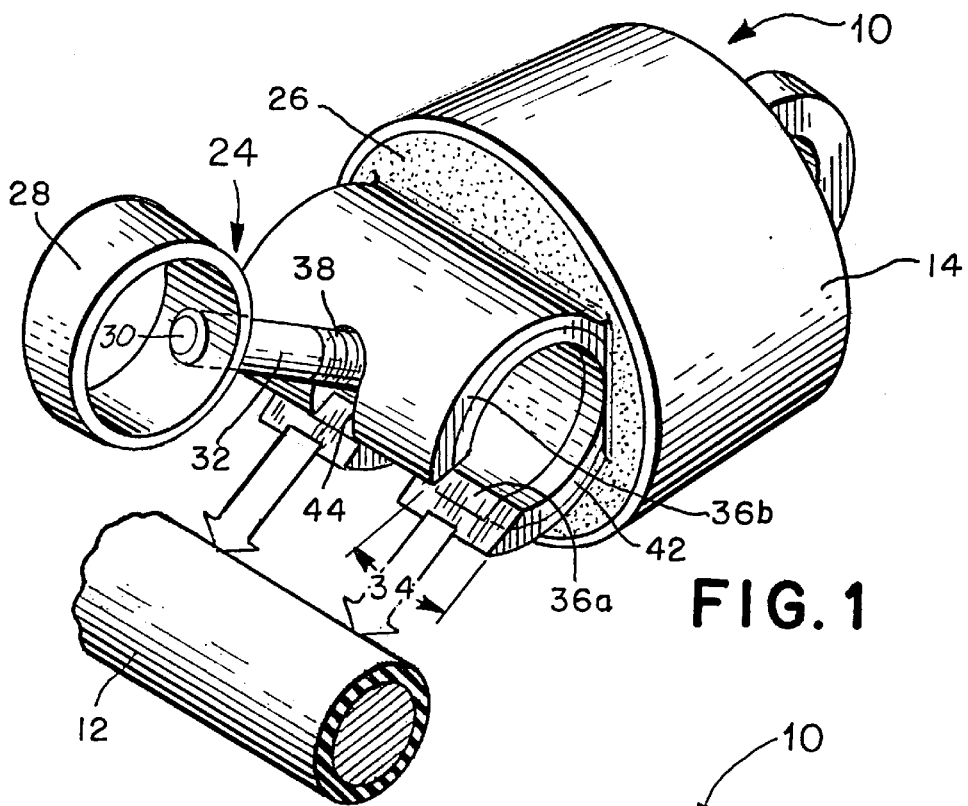
FIG. 1 is a rear perspective view of a fault indicator incorporating a clamping mechanism constructed in accordance with the principles of the present invention showing the mechanism before clamping on a cable.

Referring to the FIGS. and FIGS. 1–5 in particular, a circuit monitoring device, in this case a fault current indicator 10, is illustrated as it is installed on an electrical cable 12 of an electrical power distribution system. Fault indicator 10 includes a cylindrical housing 14 at the front face 16 (FIG. 5) of which a cylindrical readout 18 displays the condition of the circuit with an internal indicator flag 20 visible through a window 22. Upon the occurrence of a fault, flag 20 rotates to a position (not shown) to provide a visual indication that current in excess of a predetermined level has flowed in cable 12.

In order for the fault indicator 10 to accurately respond to the occurrence of a fault current in cable 12, it is necessary that the device be firmly positioned adjacent the cable. To this end, the fault indicator 10 is provided with a clamp mechanism 24 constructed in accordance with the invention. As seen in FIGS. 1–4, the clamp mechanism 24 extends from the rear wall 26 of housing 14 opposite cylindrical readout 18 and fixes the device in close contact with the cable 12.

Figure 2:
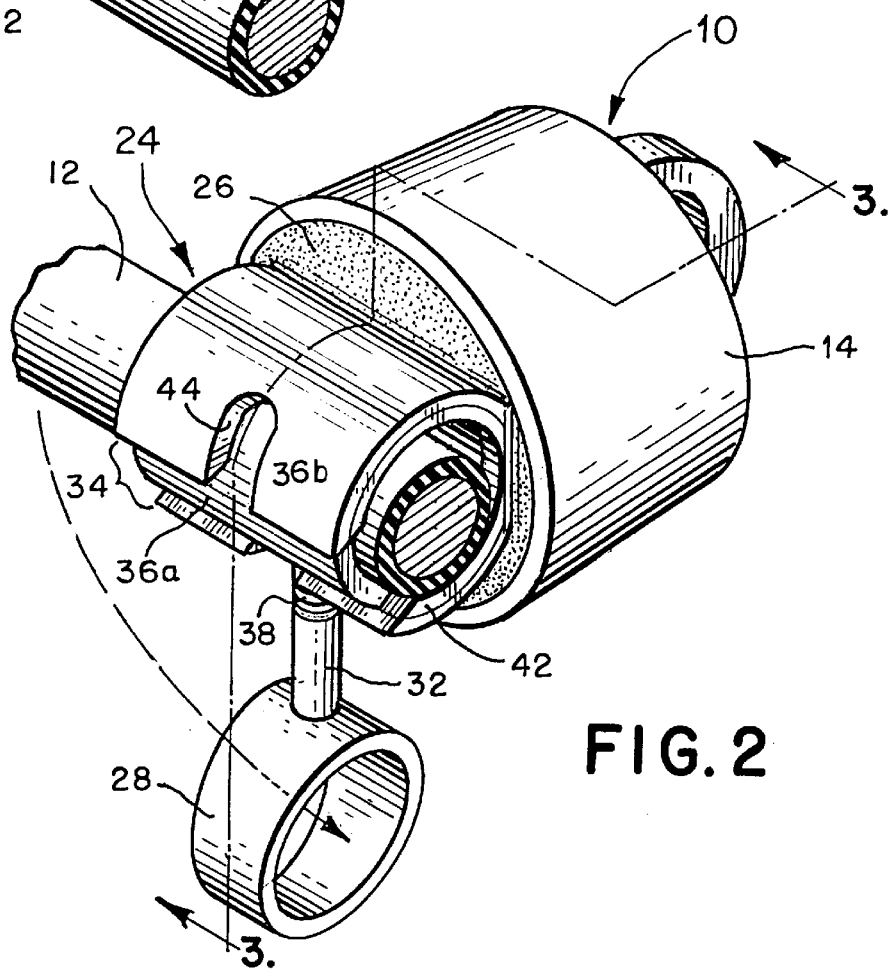
FIG. 2 is the mechanism as shown in FIG. 1 after it has been clamped onto a cable.

The steps used to firmly position the device onto a cable are illustrated in FIGS. 1–3. Hotstick (not show) engaging means in the form of a ring 28 are preferably formed on the end 30 of a rod 32 whereby the indicator can be readily and safety positioned upon a cable 12. The live line tool, or hotstick is of conventional construction and is employed for manipulating the monitoring device 10 and applying it to or removing it from the cable 12. Once the cable 12 is passed through a gap 34 in the pair of sleeves 36, the hotstick then maneuvers the rod 32 in order to close the gap 34. The closing of the gap is accomplished by moving the inner sleeve 36a, attached to the threaded end 38 of the rod 32, relative to the fixed outer sleeve 36b. When this movement is complete and the gap is closed, as shown from FIG. 1 to FIG. 2, the hotstick is further used to rotate and in effect screw the rod 32 further through the inner sleeve 36a to clamp against the cable 12 as shown in FIG. 3.

Once the location for the fault indicator 10 is chosen, and it has been clamped upon the cable 12 as shown in FIG. 4, monitoring of the cable is facilitated. All one needs to do is monitor the window 22 of the fault indicator 10 for an indication of a flag and thus a problem within the distribution system. The view of indicator 10 as it is clamped upon cable 12 and monitoring is shown in FIG. 5. It can be seen that the present invention provides for diverse positioning of the indicator 10 while also providing a highly readable and accurate readout 18.

The inner workings of the clamping mechanism of the present invention may be better understood by the examination of FIGS. 6–7b, and in particular FIG. 6. The exploded view of FIG. 6 depicts all of the components of the clamping mechanism 24 element by element. The outer sleeve 36b, which is fixed to the rear wall 26 of housing 14, includes an outer diameter and an inner diameter. The inner diameter of the outer sleeve 36b is slightly larger than the outer diameter of the inner sleeve 36a so as to enable the inner sleeve 36a to rotate inside the outer sleeve 36b.

The inner sleeve 36a includes a threaded aperture 40 adapted to receive the threaded end 38 of rod 32. The inner sleeve 36a is held within the outer sleeve via two holding rings 42 positioned on opposite sides of the inner sleeve 36a when assembled.

When the gaps 34 of all components are in the open position, the rod 32 is positioned at the top most point of the first notch 44 of the outer sleeve 36b. Then, as the cable 12 is passed through these gaps, the rod 32 transverses out of the first notch 44, through the gap 34 and into the second notch 46 on the outer sleeve. The transversion from the first notch (44) to the second notch (46) in effect rotates the inner sleeve 36a with respect to the outer sleeve 36b and closes the gap 34. This rotation is depicted in FIGS. 7a–7b.

Once this rotation of the inner sleeve 36a is complete, the rod is then rotated so as to screw itself further into the inner sleeve 36a. This rotation of the rod 32, shown in FIG. 3, then clamps the device securely upon the cable.

It will be appreciated that while the clamp mechanism of the invention has been shown in conjunction with the fault indicating devices, it may be used with other types of circuit conditioning monitoring devices, such as voltage indicators.

While particular embodiments of the invention have been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A clamping mechanism for mounting a circuit condition monitoring device on an electrical cable having a predetermined range of diameters, comprising:

a housing for said monitoring device having a clamp mounting surface;

a cylindrical outer sleeve fixedly attached on said surface, said outer sleeve including a first longitudinal gap for passing said cable therethrough;

a cylindrical inner sleeve positioned within and concentric with said outer sleeve, said inner sleeve being movable relative to said outer sleeve and including a second longitudinal gap for passing said cable therethrough, said inner sleeve further including a first position and a second position, said first position aligning with said first and second gap to form one installation gap for passing the cable therethrough;

means for moving said inner sleeve from said first position to said second position, said second position closing said installation gap; and means for clamping said cable against an inside surface of said inside sleeve when said inside sleeve is in said second position.

2. A clamping mechanism as defined in claim 1 further including a pair of rings fixed relative to said device and positioned within said outer sleeve and further positioned on opposite sides of said inner sleeve for stabilizing the movement of said inner sleeve, said rings including a pair of third gaps, said third gaps being aligned with said first gap for passing a cable therethrough.

3. A clamping mechanism as defined in claim 1 wherein said inner sleeve includes an aperture for receiving a rigid member, said rigid member includes an aperture receiving end and a device positioning end.

4. A clamping mechanism as defined in claim 3 wherein said device positioning end being further adapted to receive a hook of a hot line stick for positioning and clamping said device to said cable.

5. A clamping mechanism as defined in claim 3 wherein said aperture includes grooves.

6. A clamping mechanism as defined in claim 5 wherein said aperture receiving end of said rigid member includes threads adapted to receive said grooves.

7. A clamping mechanism as defined in claim 3 wherein said outer sleeve includes at least one notch so as to enable said rigid member to transverse a length thereof as said rigid member moves said inner sleeve.

8. A clamping mechanism for mounting a circuit conditioning monitoring device on electrical cables having a predetermined range of diameters, comprising:

a housing for said monitoring device having a clamp mounting surface;

a first sleeve fixedly attached to said surface, said first sleeve includes an inner surface, said first sleeve further including a first longitudinal gap for passing said cable therethrough;

a second sleeve concentric to said first sleeve, said second sleeve includes an outside surface and an inside surface, said outside surface of said second sleeve bearing against said inside surface of said first sleeve, said second sleeve further including a second longitudinal gap for passing said cable therethrough; said second sleeve further including a first position and a second position, said first position aligning said first gap with said second gap to form a longitudinal installation gap for passing said cable therethrough;

means for rotating said second sleeve between said first position to said second position, said second position closing said installation gap; and means for clamping said cable against said inside surface of said second sleeve.

9. A clamping mechanism as defined in claim 8 further including a pair of concentric fixedly attached rings positioned within said first sleeve and further positioned on opposite sides of said second sleeve for stabilizing the movement of said second sleeve, said rings including a pair of third gaps, said third gaps being aligned with said first gap for passing said cable therethrough.

10. A clamping mechanism as defined in claim 8 wherein said second sleeve includes an aperture for receiving a rigid member, said rigid member includes an aperture receiving end and a device positioning end.

11. A clamping mechanism as defined in claim 10 wherein said device positioning end being further adapted to receive a hook of a hot line stick for positioning and clamping said device to said cable.

12. A clamping mechanism as defined in claim 10 wherein said aperture includes grooves.

13. A clamping mechanism as defined in claim 12 wherein said aperture receiving end of said rigid member includes threads adapted to receive said grooves.

14. A clamping mechanism as defined in claim 10 wherein said first sleeve includes at least one notch so as to enable said rigid member to transverse a length thereof as said rigid member moves said second sleeve.

15. A clamping mechanism for mounting a circuit condition monitoring device on electrical cables having a predetermined range of diameters, comprising:

a housing for said monitoring device having a clamp mounting surface;

a cylindrical outer sleeve fixedly attached on said surface, said outer sleeve including a first longitudinal gap for passing said cable therethrough;

a cylindrical inner sleeve positioned within said outer sleeve, said inner sleeve being movable relative to said outer sleeve and including a second longitudinal gap for passing said cable therethrough, said inner sleeve further including a first position and a second position, said first position aligning said first gap and said second gap to form a longitudinal installation gap for passing said cable therethrough;

a means for moving said inner sleeve from said first position to said second position, said second position closing said installation gap; and means for expanding said inner sleeve so that an outer surface of said inner sleeve frictionally engages an inner surface of said outer sleeve to lock said inner sleeve in said second position.

16. A clamping mechanism as defined in claim 15 wherein said means for expanding further locks said device on said cable.

17. A clamping mechanism as defined in claim 15 further including a pair of rings fixed relative to said device and positioned within said outer sleeve and further positioned on opposite sides of said inner sleeve for stabilizing the movement of said inner sleeve, said rings including a pair of third gaps, said third gaps being aligned with said first gap for passing said cable therethrough.

18. A clamping mechanism as defined in claim 15 wherein said inner sleeve includes an aperture for receiving a rigid member, said rigid member includes an aperture receiving end and a device positioning end.

19. A clamping mechanism as defined in claim 18 wherein said device positioning end being further adapted to receive a hook of a hot line stick for positioning and clamping said device to said cable.

20. A clamping mechanism as defined in claim 18 wherein said aperture includes grooves.

21. A clamping mechanism as defined in claim 20 wherein said aperture receiving end of said rigid member includes threads adapted to receive said grooves.

22. A clamping mechanism as defined in claim 18 wherein said outer sleeve includes at least one notch so as to enable said rigid member to transverse a length thereof as said rigid member moves said inner sleeve.

* * * * *